(12) United States Patent
Arvelo et al.

(10) Patent No.: US 7,031,162 B2
(45) Date of Patent: Apr. 18, 2006

(54) METHOD AND STRUCTURE FOR COOLING A DUAL CHIP MODULE WITH ONE HIGH POWER CHIP

(75) Inventors: Amilcar R. Arvelo, Poughkeepsie, NY (US); Kamal Kumar Sikka, Poughkeepsie, NY (US); Hilton T. Toy, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 10/672,494

(22) Filed: Sep. 26, 2003

(65) Prior Publication Data

US 2005/0068739 A1    Mar. 31, 2005

(51) Int. Cl.
*H01L 23/34* (2006.01)
*H01L 23/40* (2006.01)
*H05K 7/20* (2006.01)

(52) U.S. Cl. .................. 361/718; 361/717; 257/717; 257/713; 257/707

(58) Field of Classification Search .............. 361/717, 361/718, 708; 257/707, 713, 717
See application file for complete search history.

(56) References Cited

U.S. PATENT DOCUMENTS

| | | | | |
|---|---|---|---|---|
| 5,094,769 A | * | 3/1992 | Anderson et al. | 252/71 |
| 5,819,402 A | * | 10/1998 | Edwards et al. | 29/840 |
| 5,880,524 A | * | 3/1999 | Xie | 257/704 |
| 5,966,290 A | * | 10/1999 | Sammakia et al. | 361/705 |
| 6,058,015 A | * | 5/2000 | Sammakia et al. | 361/705 |
| 6,091,603 A | * | 7/2000 | Daves et al. | 361/704 |
| 6,251,709 B1 | * | 6/2001 | Yoshikawa | 438/123 |
| 6,275,381 B1 | * | 8/2001 | Edwards et al. | 361/717 |
| 6,444,496 B1 | * | 9/2002 | Edwards et al. | 438/122 |
| 2002/0038704 A1 | * | 4/2002 | Houle et al. | 165/185 |
| 2003/0153665 A1 | * | 8/2003 | Tobita et al. | 524/404 |
| 2003/0203181 A1 | * | 10/2003 | Ellsworth et al. | 428/307.3 |
| 2004/0081843 A1 | * | 4/2004 | Bunyan | 428/517 |

* cited by examiner

*Primary Examiner*—Anatoly Vortman
(74) *Attorney, Agent, or Firm*—Gibb I.P. Law Firm, LLC; James J. Cioffi, Esq.

(57) ABSTRACT

Disclosed is a cooling structure which has individual spreaders or caps mounted on the chips. The thickness of the high power spreader or cap exceeds the thickness of the lower power spreaders to ensure that the high power spreader achieves the highest plane and mates to a heat sink with the smallest interface gap. The variable and higher gaps between the lower power spreaders and the heat sink base are accommodated by compressible thermal pad or grease materials.

19 Claims, 5 Drawing Sheets

METHOD AND STRUCTURE FOR COOLING A DUAL CHIP MODULE WITH ONE HIGH POWER CHIP

BACKGROUND OF THE INVENTION

1. Field of the Invention

The present invention generally relates to cooling structures for integrated circuit chips and more particularly to an improved cooling structure that concentrates the largest cooling capacity on the highest power chips.

2. Description of the Related Art

Multi-chip electronic packages with high power microelectronic chips are being increasingly encountered in computer and other electronic systems where a common chip carrier, whether a ceramic or an organic laminate, has a central processing unit (CPU) accompanied by one or more memory chips. These CPU and memory chips often operate at different power levels and, therefore, have different cooling needs. However, conventional structures do not address such cooling needs sufficiently. Therefore, the present invention has been created to provide cooling for such a multichip package by concentrating the largest cooling capacity on the highest power chips.

SUMMARY OF THE INVENTION

The invention presents a cooling structure for an integrated circuit structure that has multiple integrated circuit chips. In one embodiment, the cooling structure comprises heat spreaders and a heat dissipating structure. The lower side of each of the heat spreaders is connected to the top of a corresponding integrated circuit chip through thermally conductive interface materials. The upper side of the heat spreaders is connected to a heat dissipating structure through thermally conductive materials which are positioned in gaps between the upper sides of the heat spreaders and the bottom of the heat dissipating structure. The smallest of the gaps exists between the top of the heat spreader that is connected to the integrated circuit chip that produces the most thermal energy, relative to the other integrated circuit chips, and the bottom of the heat dissipating structure.

In another embodiment, the cooling structure comprises a cap connected to the chip carrier and to the top of the integrated circuit chip that produces the most thermal energy, relative to the other integrated circuit chips. This embodiment also includes a plurality of heat spreaders, wherein the lower side of each of these heat spreaders is connected to the top of a corresponding integrated circuit chip (of the other integrated circuit chips). In this embodiment, the heat dissipating structure is connected to the upper sides of the heat spreaders and the cap through thermally conductive material. The thermally conductive material are positioned in gaps, wherein the gaps exist between the tops of the heat spreaders and the bottom of heat dissipating structure, and between the upper side of the cap and the bottom of the heat dissipating structure. Here, the smallest of the gaps exists between the upper side of the cap and the bottom of the heat dissipating structure.

In a further embodiment, the cooling structure comprises a heat spreader connected to the integrated circuit chip that produces the most thermal energy, relative to the other integrated circuit chips and a heat dissipating structure connected to the upper side of the heat spreader and to the upper sides of the other integrated circuit chips. Thermally conductive materials are positioned in gaps that exist between the upper side of the heat spreader and the bottom of the heat dissipating structure, and between the upper sides of the integrated circuit chips and the bottom of the heat dissipating structure. Again, the smallest of the gaps exists between the upper side of the heat spreader and the bottom of the heat dissipating structure.

In an additional embodiment, the cooling structure comprises a heat dissipating structure connected to the upper sides of the integrated circuit chips through a thermally conductive material, where the heat dissipating structure is shaped such that the smallest gap exists between the top of the integrated circuit chip that produces the most thermal energy and the bottom of the heat dissipating structure. In this embodiment, the heat dissipating structure has a protrusion positioned adjacent the integrated circuit chip that produces the most thermal energy to allow the smallest of the gaps to exist between the top of the integrated circuit chip that produces the most thermal energy and the bottom of the heat dissipating structure.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
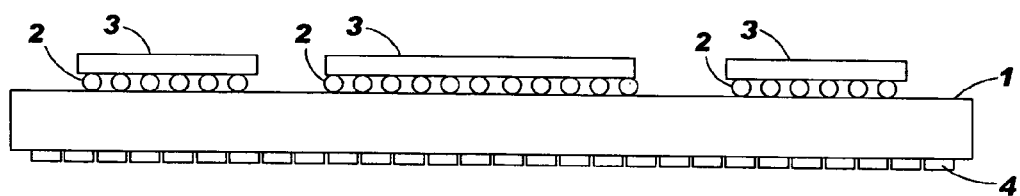
FIG. 1 is a sectioned view of a chip-carrier with several chips mounted thereon.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

FIG. 1 shows a multi-chip package where several chips 3 are mounted, through C4 interconnections 2, on a common chip carrier 1 to reduce the inter-chip electrical wiring. The top surfaces of the different chips lie in different planes due to the variations in the thickness of the different chips 3, the heights of the C4 interconnections 2, and camber (distortion) in the chip-carrier 1. The chip-carrier 1 attaches to a printed circuit card (not shown) through LGA, CGA, BGA or other interconnection types 4.

Figure 2:
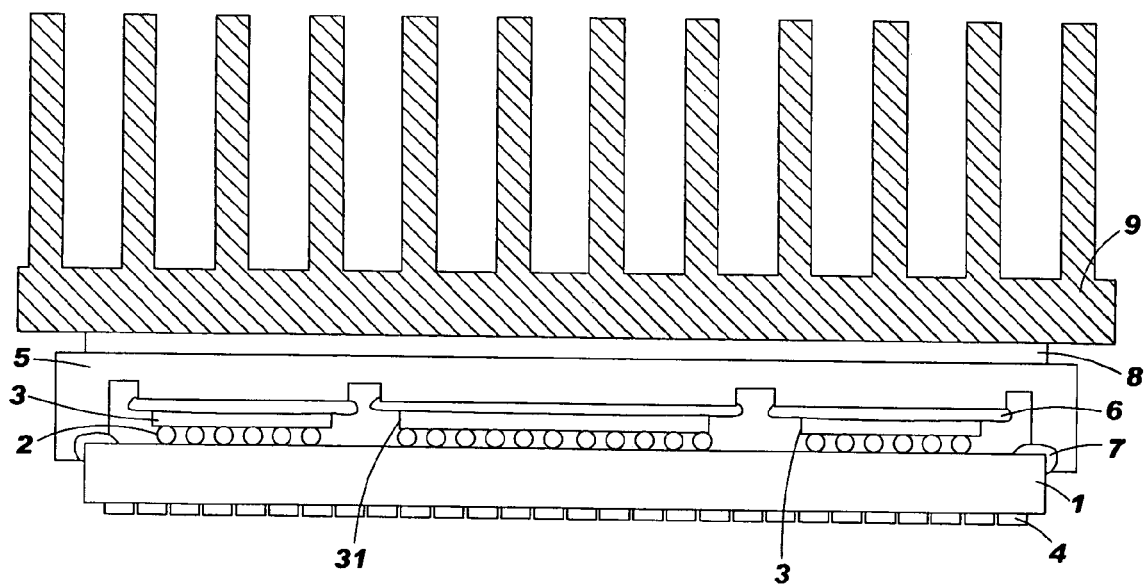
FIG. 2 is a cooling structure showing a common cap with a thermal compound between the chips and the cap.

A cooling structure 9, shown in FIG. 2, comprises a common high thermal conductivity cap 5 adhered to the chip carrier 1 through a sealant material 7 which may be an elastomer, epoxy or a mechanical seal such as an o-ring. The different gaps between the various chips 3 and the cap 5 accommodate a thermal compound 6 which may be a grease, adhesive, or phase change material. The heat sink 9 can be attached to the cap 5 though a thermal interface material 8 to dissipate the heat to the ambient.

One drawback of the structure in FIG. 2 is that the cooling is not optimized for the highest power chip (e.g., chip 31) since the smallest chip 3 to cap 5 gap may not be necessarily achieved at the highest power chip 31. With the limited thermal conductivity of the presently available thermal compounds 6, the cooling capacity of the structure in FIG. 2 cannot match the requirements of many multi-chip packages. In addition if a high thermal mass cap 5 is used, problems with attaching the multi-chip package to the printed circuit card can be expected for CGA and BGA interconnection types which require high-temperature processing to reflow their constituent solder materials.

Figure 3:
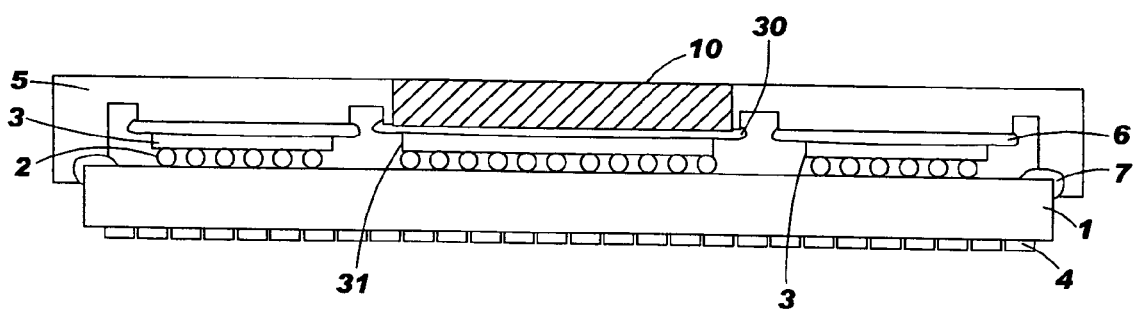
FIG. 3 is an enhanced cooling structure showing a customized piston for controlling the chip to piston gap on the high power chip.
Figure 4:
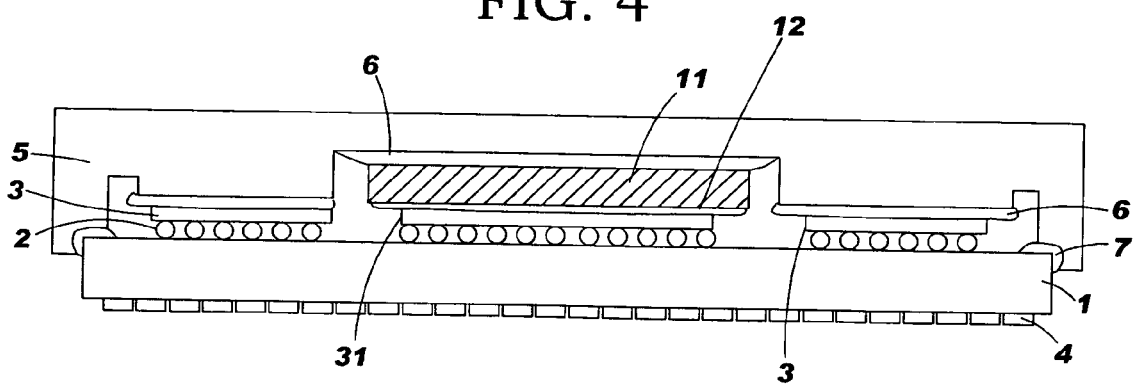
FIG. 4 is an enhanced cooling structure showing a heat spreader mounted on the high power chip.

To enhance the cooling efficiency, other structures described in FIGS. 3 and 4 have been created. In FIG. 3, a piston 10 is integrated into the cap 5 and attached with a solder or other adherent material 30. The gap between the highest power chip 31 and piston 10 is minimized during the assembly process by reflowing the solder 30 or inserting the adherent material 30 after compressing the piston 10 to achieve a desired gap between the chip 31 and piston 10. The top surface of the cap 5 is machined to obtain a flat surface (to avoid having the piston 10 stick out of the cap 5 and avoid having a recess above the piston 10) after assembly in order to interface with a heat sink 9.

In FIG. 4, a heat spreader 11 is attached to the highest power chip 31 with a high-conductivity thermal interface compound 12. Another thermal compound such as 6 can be inserted between the spreader 11 and the cap 5. The cooling designs in FIGS. 3 and 4 add cost and assembly complexity. Further, such structures do not diminish the difficulty with which cards with CGA and BGA interconnections 4 are attached. For example, problems arise due to the high weight and thermal mass of the capping structure in pick-and-place and solder reflows for card attaching.

Figure 5:
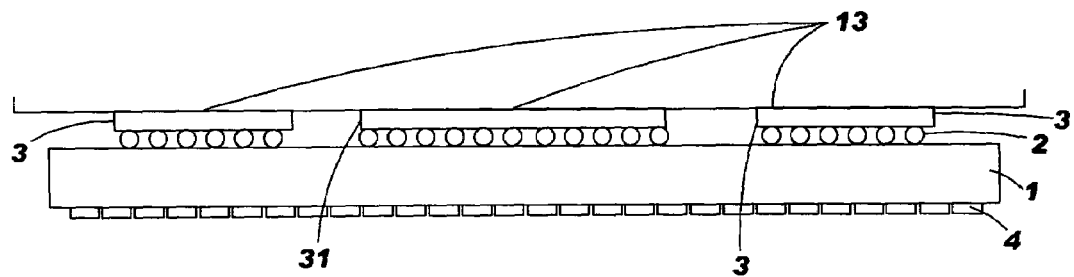
FIG. 5 shows that the back-sides of the chips can be ground to achieve a common plane.

FIG. 5 illustrates another cooling structure that is produced by grinding the back-side of the chips 3, 31 to achieve a common plane 13 as shown in FIG. 5. Another manifestation of the back-side grinding grinds the height of the lower power chips 3 to below the level of the higher power chips 31 to allow the highest power chip(s) 31 to achieve the highest plane (be the tallest chip) so that the smallest chip to cap 5 gap is achieved at the highest power chip 31, after the heat sink 9 is attached. Back-side grinding of the chips at the wafer or individual chip level adds significant process complexity and cost.

Figure 6:
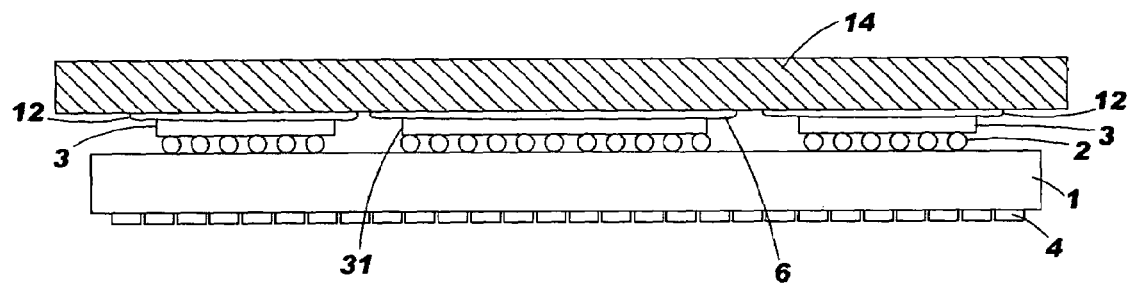
FIG. 6 is a cooling structure showing a planar common spreader attached to all the chips.

In FIG. 6, a planar spreader 14 is attached to a structure with ground chips so that the smallest chip to spreader 14 gap is achieved at the highest power chip 31 for optimized cooling. A drawback to the structure in FIG. 6 is that high mechanical stress can be generated in the thermal adhesive 12 between the chip 3 and spreader 14 due to the large distance from neutral point (DNP) in the thermal compound 6 for the chips 3 located at the extreme edges of the chip carrier 1. The high mechanical stresses are generated due to the thermal expansion mismatch between the spreader and the underlying chip during field operation.

Figure 7:
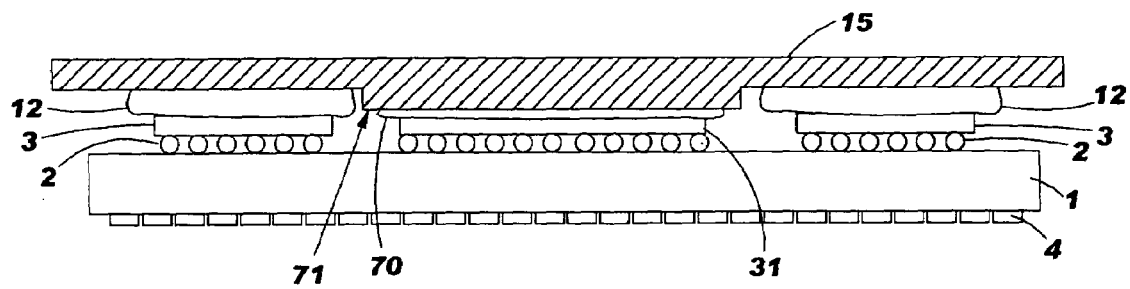
FIG. 7 is a cooling structure where a stepped spreader is used to achieve the smallest chip to spreader gap on the high power chip.

FIG. 7 is a variant of FIG. 6, but the structure in FIG. 7 does not require grinding the chip back-sides. A non-planar heat spreader 15 with steps is used so that smallest chip to spreader 15 gap is established at the high power chip 31. The drawback to the stepped spreader is the added cost required to include the steps in the heat spreader 15, in addition to the mechanical stress issue of large DNP, discussed above.

Thus, the inventive cooling structure comprises a heat dissipating structure (e.g., heat sink) 15 connected to the upper sides of the integrated circuit chips 3, 31 through a thermally conductive material 12, 70, where the heat dissipating structure is shaped such that the smallest gap exists between the top of the integrated circuit chip that produces the most thermal energy 31 and the bottom of the heat dissipating structure 15.

In this embodiment, the heat dissipating structure has a protrusion (step) 71 positioned adjacent the integrated circuit chip that produces the most thermal energy 31 to allow the smallest of the gaps to exist between the top of the integrated circuit chip that produces the most thermal energy 31 and the bottom of the heat dissipating structure 15. The thermally conductive materials 12, 70 comprise a thermally conductive adhesive and can comprise a plurality of thermally conductive materials having different coefficients of thermal conductivity.

Figure 8:
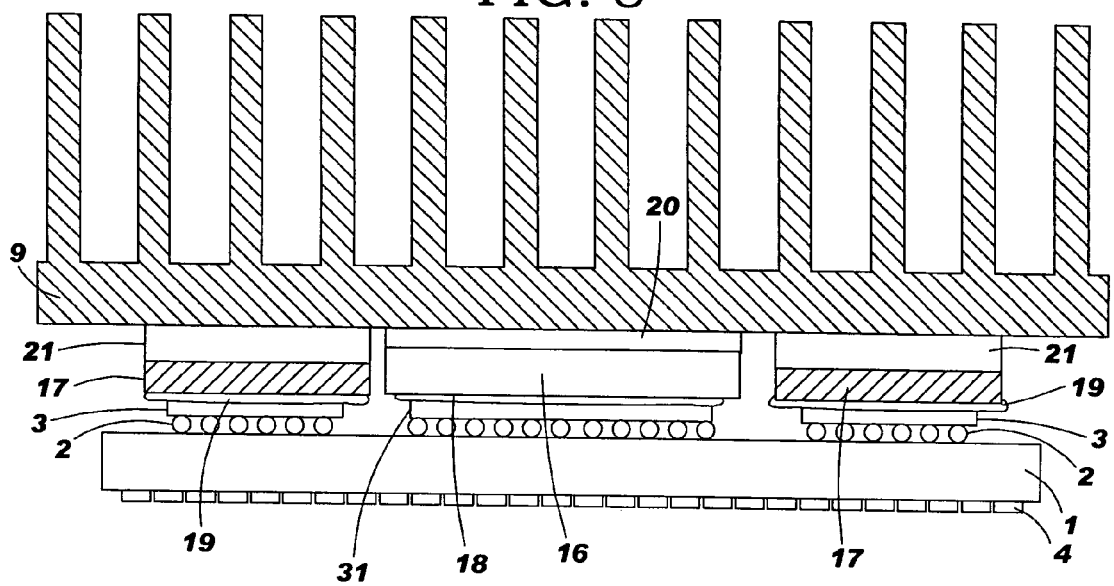
FIG. 8 is a cooling structure where individual spreaders are attached to chips with the spreader on the high power chip achieving the highest plane.

In the embodiment shown in FIG. 8, differently sized heat spreaders 16 and 17 are attached to the chips 3, 31 with common thermally conductive adhesive materials 18 and 19. The thickness of the high power spreader 16 (the spreader attached to the highest power chip 31) exceeds the thickness of the lower power spreaders 17 (the spreaders attached to the lower power chips 3) to ensure that the high power spreader 16 achieves the highest plane (e.g., extends higher than (above) the lower power spreaders 17). This ensures that when the package mates with the flat base of a heat sink 9, the smallest thermal interface gap is achieved between the highest power spreader 17 (which is the tallest spreader) and the heat sink 9, allowing optimum cooling.

The spreader materials 16 and 17 can be identical or the high power spreader 16 can have a higher thermal conductivity than the lower power spreaders 17. Similarly, the adhesive materials 18 and 19 and greases/solders 20, 21 on the chips can be identical, or an adhesive having a higher thermal conductivity 18 (when compared to adhesive 19) and grease/solder having a higher thermal conductivity 20 (when compared to grease/solder 21) can be used to attach the high power heat spreader 16. As would be understood by one ordinarily skilled in the art, different combinations of high/low thermally conductive spreaders, adhesives, greases, and solders can be used with the invention to achieve any specific desired ratios of thermal conductivity.

Thus, the embodiment shown in FIG. 8 presents a cooling structure for an integrated circuit structure that has multiple integrated circuit chips 3, 31. More specifically, the cooling structure comprises heat spreaders 16, 17 and a heat dissipating structure 9 connected to the upper sides of the heat spreaders 16, 17 through a thermally conductive material 20, 21. The lower side of each of the heat spreaders 16, 17 is connected to the top of a corresponding integrated circuit chip 3, 31. The thermally conductive material 20, 21 is positioned in gaps between the upper sides of the heat spreaders 16, 17 and the bottom of the heat dissipating structure 9, and the smallest of the gaps exists between the top of the heat spreader 16 that is connected to the integrated circuit chip 31 that produces the most thermal energy, relative to the other integrated circuit chips, and the bottom of the heat dissipating structure 9.

As shown above, the heat spreaders 16, 17 can have different thicknesses and can have different coefficients of thermal conductivity. One or more thermally conductive adhesives 18, 19 connect the heat spreaders 16, 17 to the integrated circuit chips 3, 31. The thermally conductive material 20, 21 can comprise a plurality of thermally conductive materials having different coefficients of thermal conductivity and can be a thermal grease or a phase change material. As mentioned above, the integrated circuit chips comprise at least one higher power chip 31 and at least one lower power chip 3, wherein, during operation, the higher power chip 31 generates more thermal energy than the lower power chips 3.

Figure 9:
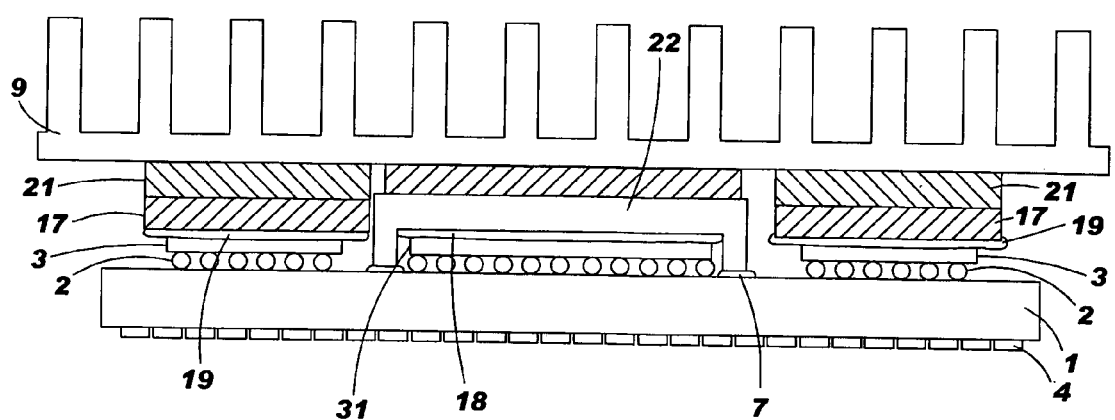
FIG. 9 is a cooling structure where the spreaders in FIG. 8 are replaced by caps.

FIG. 9 illustrates a cap 22 attached to the chip carrier 1 that replaces the heat spreader 16 on the high power chip 31, while heat spreaders 17 are used on the lower power chips 3. The cap 22 is formed to lie in a higher plane than the heat spreaders 17 (e.g., to have an upper surface that is above the upper surfaces of the heat spreaders 17) so that the cap is taller (higher) than the lower power spreaders 17. The heat sink 9 would be connected to the cap 22 and heat spreaders 17 as shown in FIG. 8, and the smallest gap would exist between the cap 22 and the heat sink 9 in a similar manner to the heat spreader 16 above. One ordinarily skilled in the art would understand that caps of different heights could be formed above all the chips 3, 31, with the highest power chip 31 having the tallest cap. When caps are used, adhesives are not necessary. Therefore, in the embodiments with caps, the adhesive 18 between the chip 31 and cap 22 can be replaced by a soft material such as a thermal grease or phase change material.

Thus, in the embodiment shown in FIG. 9, the cooling structure comprises a cap 22 connected to the chip carrier 1 and to the top of the integrated circuit chip 31 that produces the most thermal energy, relative to the other integrated circuit chips. This embodiment also includes a plurality of heat spreaders 17, wherein the lower side of each of these heat spreaders 17 is connected to the top of a corresponding integrated circuit chip of the other integrated circuit chips 3. In this embodiment, the heat dissipating structure 9 is connected to the upper sides of the heat spreaders 17 and the cap 22 through the thermally conductive material 20, 21. The thermally conductive material 20, 21 is positioned in gaps, wherein the gaps exist between the tops of the heat spreaders 17 and the bottom of heat dissipating structure 9, and between the upper side of the cap 22 and the bottom of the heat dissipating structure 9. Here, the smallest of the gaps exists between the upper side of the cap 22 and the bottom of the heat dissipating structure 9.

Figure 10:
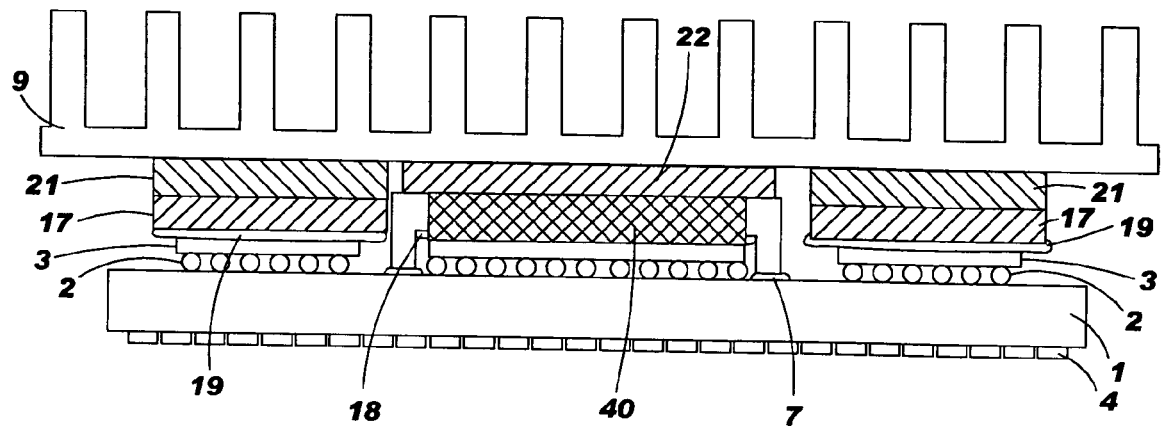
FIG. 10 is a cooling structure where the spreaders in FIG. 8 are replaced by caps.

As shown in FIG. 9, the heat spreaders 17 have different thicknesses than the cap 22 and the heat spreaders 17 may have different thicknesses than each other. A movable piston 40 can also be included in the cap, as shown in FIG. 10, to minimize the thickness of the thermal interface material 18 between the chip 31 and the cap 22. During manufacturing, the piston 40 can be moved into a position to minimize the gap between the bottom of the piston 40 and the top of the highest power chip 31. After this, the position of the piston 40 is fixed and the top surface of the cap 22 and piston 40 are planarized. As mentioned above, the heat spreaders 17 may have different coefficients of thermal conductivity than the cap 22. A thermal adhesive 19 connects the heat spreaders 17 to the integrated circuit chips 3. This thermally conductive material 19 can comprises a plurality of thermally conductive materials having different coefficients of thermal conductivity. The thermally conductive material 18 comprises one of a thermal grease and a phase change material. The heat sink 9 and thermally conductive materials 20, 21 are attached to the structures shown in FIGS. 9 and 10.

Figure 11:
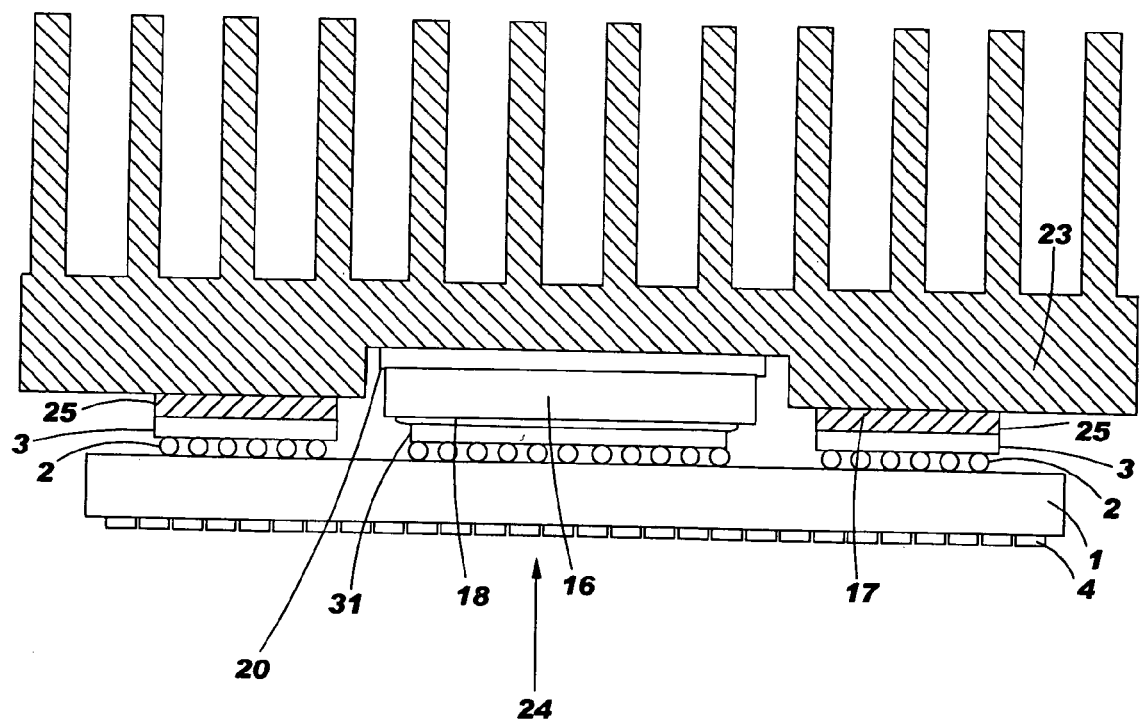
FIG. 11 is a cooling structure where the heat sink is modified to form a cavity in which the high power chip and spreader are enclosed.

In FIG. 11, the heat sink 23 is modified to form a cavity 24 in which the high power spreader 16 or cap 22 is enclosed. The heat sink 23 can interface directly to the lower power chips 3 through well-known compressible thermal interface materials 25. Thus, the resultant variable gaps between the lower power spreaders and the heat sink base are accommodated by highly compressible thermal pad or grease materials which have lower required thermal performance but can span gaps of the order of millimeters.

Thus, FIG. 11 illustrates a further embodiment where the cooling structure comprises a heat spreader 16 connected to the integrated circuit chip that produces the most thermal energy 31 and a heat dissipating structure 23 connected to the upper side of the heat spreader 16 and to the upper sides of the other integrated circuit chips 3. Thermally conductive material 20, 25 is positioned in gaps that exist between the upper side of the heat spreader 16 and the bottom of the heat dissipating structure 23, and between the upper sides of the integrated circuit chips 3 and the bottom of the heat dissipating structure 23. Again, the smallest of the gaps exists between the upper side of the heat spreader 16 and the bottom of the heat dissipating structure 23.

The heat dissipating structure 23 includes a recess 24 for accommodating the heat spreader 16. A thermal adhesive 18 connects the heat spreader 16 to the integrated circuit chip that produces the most thermal energy 31. The thermally conductive materials 18, 25 can comprise a plurality of thermally conductive materials having different coefficients of thermal conductivity. The thermally conductive material 20 comprises one of a thermal grease and a phase change material.

While the foregoing examples use a structure that includes two lower power chips 3 and one higher power chip 31, the invention is equally applicable to structures that include many higher power chips. In such a situation, the invention can minimize the gap for all such higher power chips or select a very limited number (e.g., one or two) chips that will receive the most cooling. Each situation will vary depending upon the design involved and the cooling needs of the chips. Additionally, while the highest power chip is presumed to produce the most heat, if a lower power chip were to require the highest level of cooling in a given design, the invention can minimize the gap to the heat sink relating to the chip (or other circuit element) that requires the greatest level of cooling.

Thus, the cooling structure described in the present invention can have individual spreaders or caps mounted on the chips. The thickness (height) of the higher power spreader or cap is designed to exceed the height of the lower power spreaders to ensure that the high power spreader achieves the highest plane. This ensures that when the package mates with the flat base of a heat sink, the smallest thermal interface gap is achieved between the highest power spreader and the heat sink. The smallest gap will produce the greatest amount of cooling because less heat loss occurs when the thermal energy travels through a smaller amount of thermal gap material. Thus, by providing the smallest gap above the highest power chip, the highest power chip (which produces the most heat) is provided with the greatest amount of cooling.

The benefits of the invention are the low-cost of the inventive cooling assembly, the concentration of highest cooling capability on the higher power chips, and the broad adaptability to different package I/O schemes. The invention is applicable to multi-chip packages with CGA, BOA, LGA and other package I/O schemes.

While the invention has been described in terms of preferred embodiments, those skilled in the art will recognize that the invention can be practiced with modification within the spirit and scope of the appended claims.

What is claimed is:

1. A cooling structure for an integrated circuit structure having multiple integrated circuit chips, said cooling structure comprising:
   a plurality of heat spreaders having different thicknesses, wherein the lower side of each of said heat spreaders is connected to the top of a corresponding one of said integrated circuit chips; and
   a heat dissipating structure having a flat base connected to the upper sides of said heat spreaders through a thermally conductive material,
   wherein said thermally conductive material is positioned in gaps between the upper sides of said heat spreaders and said flat base of said heat dissipating structure, and
   wherein the smallest of said gaps exists between the top of the thickest of said heat spreaders that is connected to the integrated circuit chip that produces the most thermal energy, relative to the other integrated circuit chips, and said flat base of said heat dissipating structure.

2. The structure in claim 1, wherein said heat spreaders have different coefficients of thermal conductivity.

3. The structure in claim 1, further comprising a thermal adhesive connecting said heat spreaders to said integrated circuit chips.

4. The structure in claim 1, wherein said thermally conductive material comprises a plurality of thermally conductive materials having different coefficients of thermal conductivity.

5. The structure in claim 1, wherein said thermally conductive material comprises one of a thermal grease and a phase change material.

6. The structure in claim 1, wherein said integrated circuit chips comprise at least one higher power chip and at least one lower power chip, wherein, during operation, said higher power chip generates more thermal energy than said lower power chip.

7. The structure in claim 6, wherein said smallest of said gaps allows optimum cooling of said at least one higher power chip.

8. A cooling structure for an integrated circuit structure having multiple integrated circuit chips, said cooling structure comprising:
   a plurality of heat spreaders, having different thicknesses, wherein the lower side of each of said heat spreaders is connected to the top of a corresponding integrated circuit chip,
   wherein a first chip of said multiple integrated circuit chips produces the most thermal energy relative to others of said multiple integrated circuit chips, and
   wherein the thickest of said heat spreaders is connected to said first chip so as to optimize cooling of said integrated circuit structure; and
   a heat dissipating structure having a flat base connected to the upper sides of said heat spreaders through a thermally conductive material.

9. The structure in claim 8, wherein said heat spreaders have different coefficients of thermal conductivity.

10. The structure in claim 8, further comprising a thermal adhesive connecting said heat spreaders to said integrated circuit chips.

11. The structure in claim 8, wherein said thermally conductive material comprises a plurality of thermally conductive materials having different coefficients of thermal conductivity.

12. The structure in claim 8, wherein said thermally conductive material comprises one of a thermal grease and a phase change material.

13. The structure in claim 8, wherein said integrated circuit chips comprise at least one higher power chip and at least one lower power chip, wherein, during operation, said higher power chip is said one of said multiple integrated chips that produces the most thermal energy.

14. The structure in claim 8, wherein said thermally conductive material is positioned in gaps between the upper sides of said heat spreaders and said flat base of said heat dissipating structure, and wherein the smallest of said gaps exists between the top of said thickest heat spreaders and said flat base.

15. A cooling structure for an integrated circuit structure having multiple integrated circuit chips, said cooling structure comprising:

a plurality of beat spreaders, having different thicknesses;

wherein the lower side of each of said heat spreaders is connected to the top of a corresponding integrated circuit chip, wherein a first chip of said multiple integrated circuit chips produces the most thermal energy relative to others of said multiple integrated circuit chips, and wherein the thickest of said heat spreaders is connected to said first chip so as to optimize cooling of said integrated circuit structure; and a heat dissipating structure having a flat base connected to the upper sides of said heat spreaders through a thermal grease.

16. The structure in claim 15, wherein said heat spreaders have different coefficients of thermal conductivity.

17. The structure in claim 15, further comprising a thermal adhesive connecting said heat spreaders to said integrated circuit chips.

18. The structure in claim 15, wherein said integrated circuit chips comprise at least one higher power chip and at least one lower power chip, wherein, during operation, said higher power chip is said one of said multiple integrated chips that produces the most thermal energy.

19. The structure in claim 15, wherein said thermal grease is positioned in gaps between the upper sides of said heat spreaders and said flat base of said heat dissipating structure, and wherein the smallest of said gaps exists between the top of said thickest heat spreader and said flat base.

* * * * *